United States Patent
Kapusta et al.

(10) Patent No.: US 10,163,773 B1
(45) Date of Patent: Dec. 25, 2018

(54) ELECTRONICS PACKAGE HAVING A SELF-ALIGNING INTERCONNECT ASSEMBLY AND METHOD OF MAKING SAME

(71) Applicant: General Electric Company, Schenectady, NY (US)

(72) Inventors: Christopher James Kapusta, Delanson, NY (US); Kaustubh Ravindra Nagarkar, Clifton Park, NY (US); Arun Virupaksha Gowda, Rexford, NY (US); James Wilson Rose, Guilderland, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/675,144

(22) Filed: Aug. 11, 2017

(51) Int. Cl.
*H01L 23/48* (2006.01)
*H01L 23/498* (2006.01)
(Continued)

(52) U.S. Cl.
CPC .... *H01L 23/49827* (2013.01); *H01L 21/4846* (2013.01); *H01L 24/09* (2013.01);
(Continued)

(58) Field of Classification Search
CPC ........... H01L 23/49827; H01L 21/4846; H01L 24/09; H01L 24/17; H01L 24/81; H01L 2224/09505
(Continued)

(56) References Cited

U.S. PATENT DOCUMENTS 6,281,046 B1 8/2001 Lam
7,061,122 B2 6/2006 Kim et al.
(Continued)

FOREIGN PATENT DOCUMENTS

WO 2010116325 A1 10/2010

OTHER PUBLICATIONS

Lee et al., "Study of Interconnection Process for Fine Pitch Flip Chip," 2009 59th Electronic Components and Technology Conference, San Diego, 2009, pp. 720-723.
(Continued)

*Primary Examiner* — Tu-Tu V Ho
(74) *Attorney, Agent, or Firm* — Ziolkowski Patent Solutions Group, SC

(57) ABSTRACT

An electronics package includes an interconnect assembly comprising a first insulating substrate, a first wiring layer formed on a lower surface of the first insulating substrate, and at least one through hole extending through the first insulating substrate and the first wiring layer. The electronics package also includes an electrical component assembly comprising an electrical component having an active surface coupled to an upper surface of the first insulating substrate opposite the lower surface. The active surface of the electrical comprises at least one metallic contact pad. At least one conductive stud is coupled to the at least one metallic contact pad and is positioned within the at least one through hole. A conductive plug contacts the first wiring layer and extends into the at least one through hole to at least partially surround the at least one conductive stud.

19 Claims, 10 Drawing Sheets

(51) Int. Cl.
*H01L 23/00* (2006.01)
*H01L 21/48* (2006.01)

(52) U.S. Cl.
CPC ............. *H01L 24/17* (2013.01); *H01L 24/81* (2013.01); *H01L 2224/09505* (2013.01)

(58) Field of Classification Search
USPC ....................................................... 257/737
See application file for complete search history.

(56) References Cited

U.S. PATENT DOCUMENTS

| | | | |
|---|---|---|---|
| 7,998,854 B2 | 8/2011 | Viswanadam | |
| 8,163,596 B2 | 4/2012 | Kapusta et al. | |
| 9,099,340 B2* | 8/2015 | Michael | H01L 23/50 |
| 9,165,878 B2 | 10/2015 | Yang et al. | |
| 9,368,401 B2 | 6/2016 | Teh et al. | |
| 9,401,287 B2 | 7/2016 | Tan et al. | |
| 9,780,020 B2* | 10/2017 | Shimizu | H01L 21/4857 |
| 2012/0127681 A1* | 5/2012 | Ryu | H05K 3/306 |
| | | | 361/772 |
| 2015/0294951 A1 | 10/2015 | Smits et al. | |
| 2016/0013121 A1 | 1/2016 | Dix et al. | |

OTHER PUBLICATIONS

Jaakola et al., "Low Cost Printed Flexible Multilayer Substrates," 2008 10th Electronics Packaging Technology Conference, Singapore, 2008, pp. 344-349.

\* cited by examiner

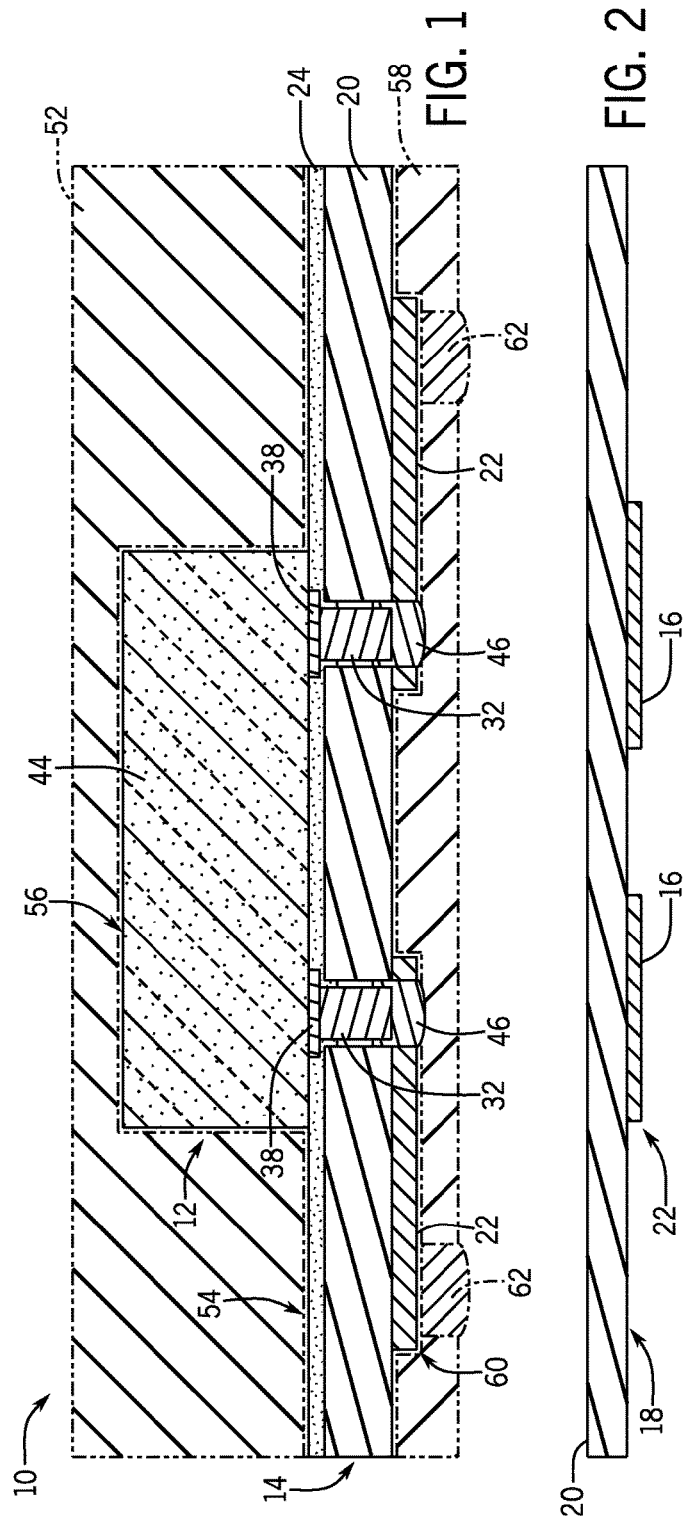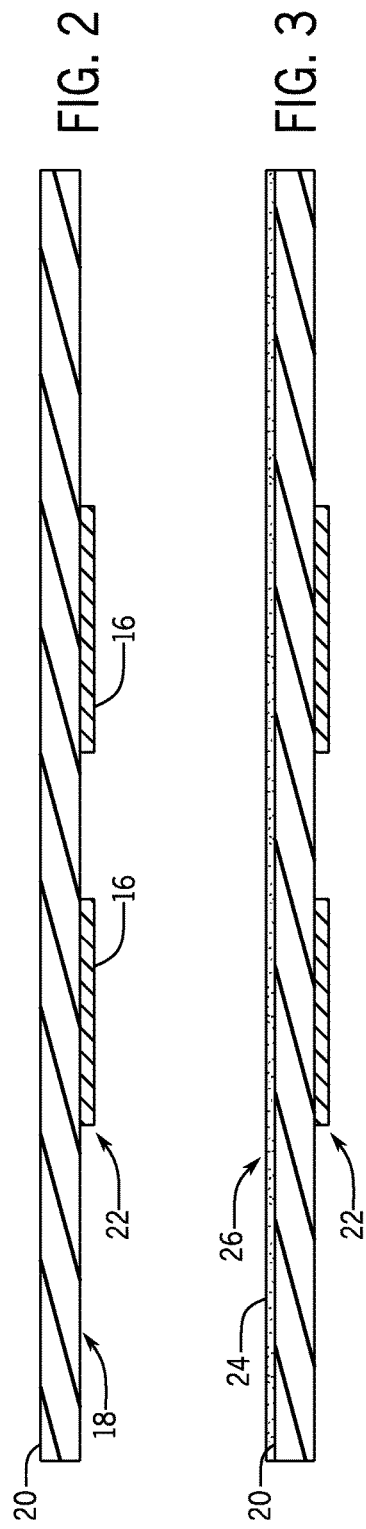

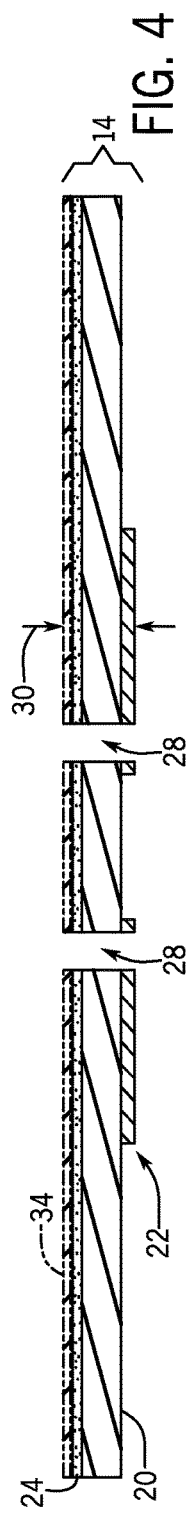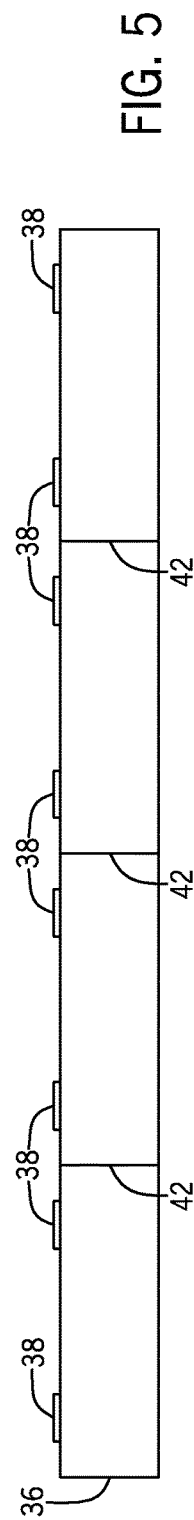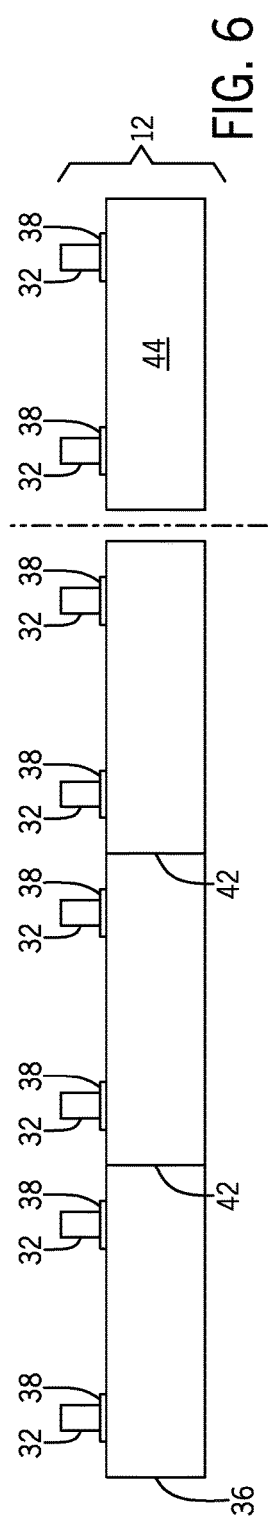

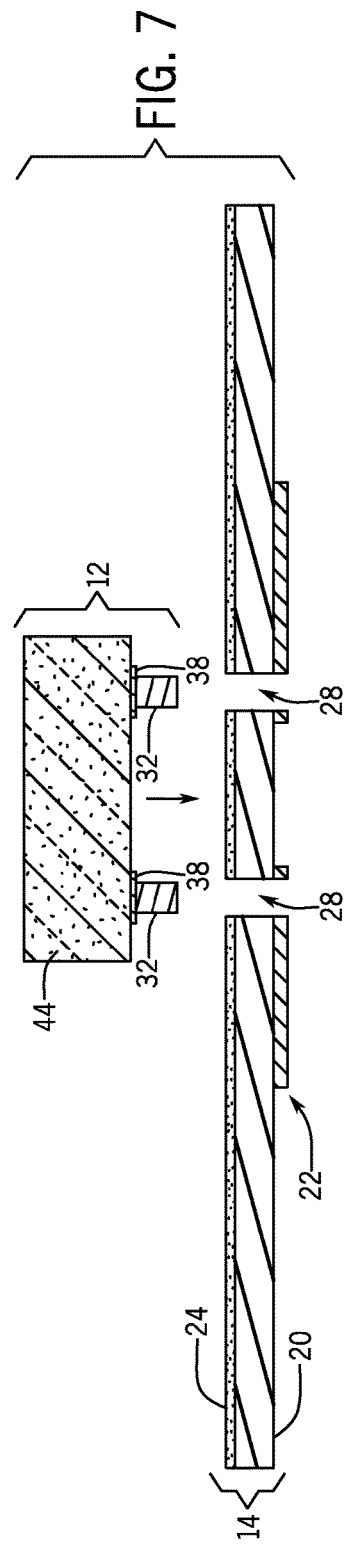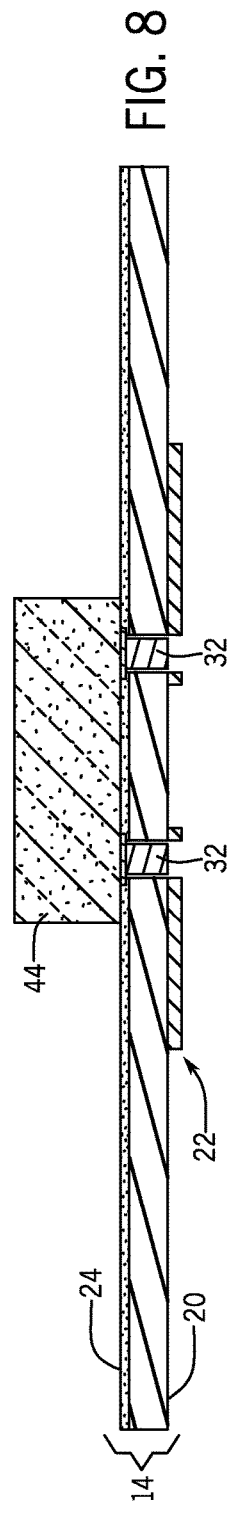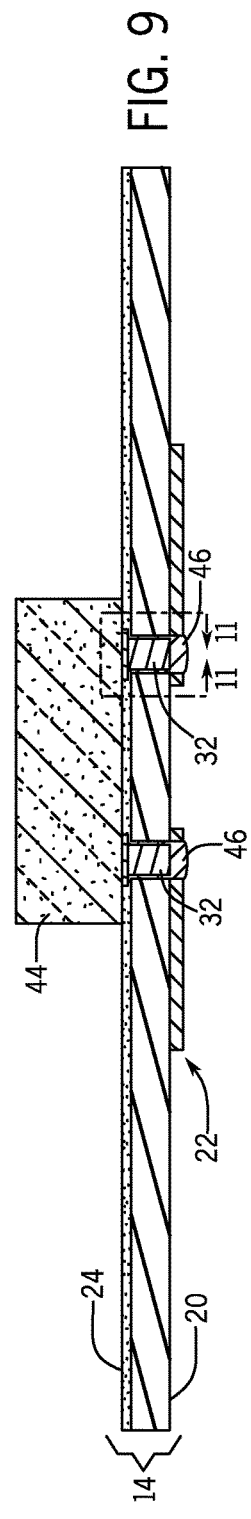

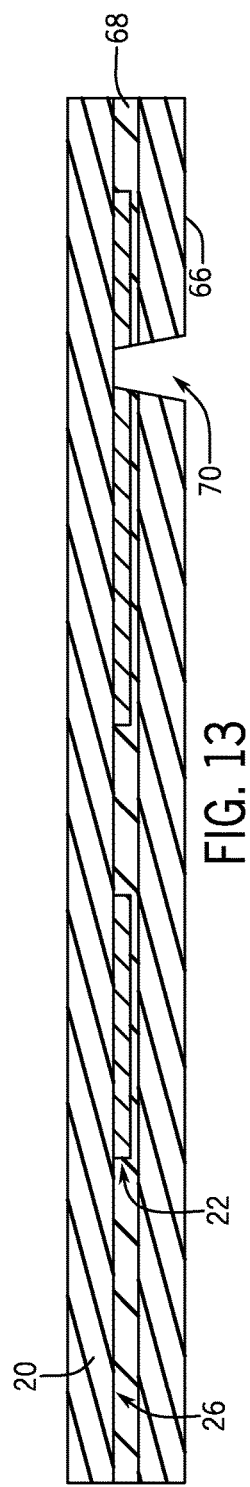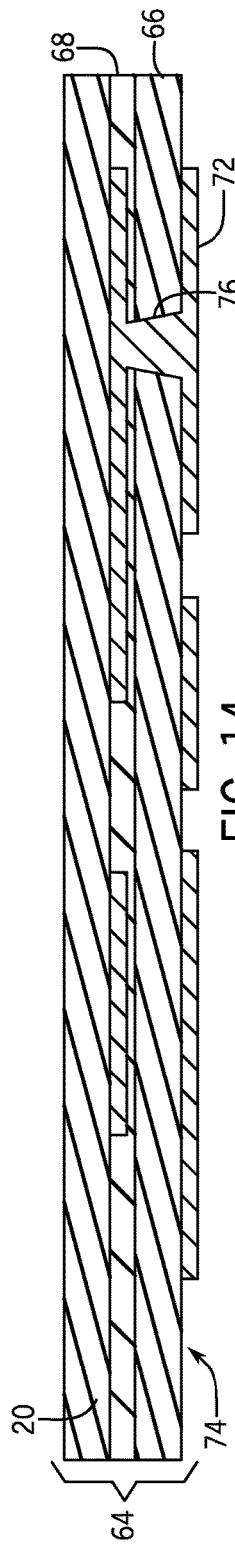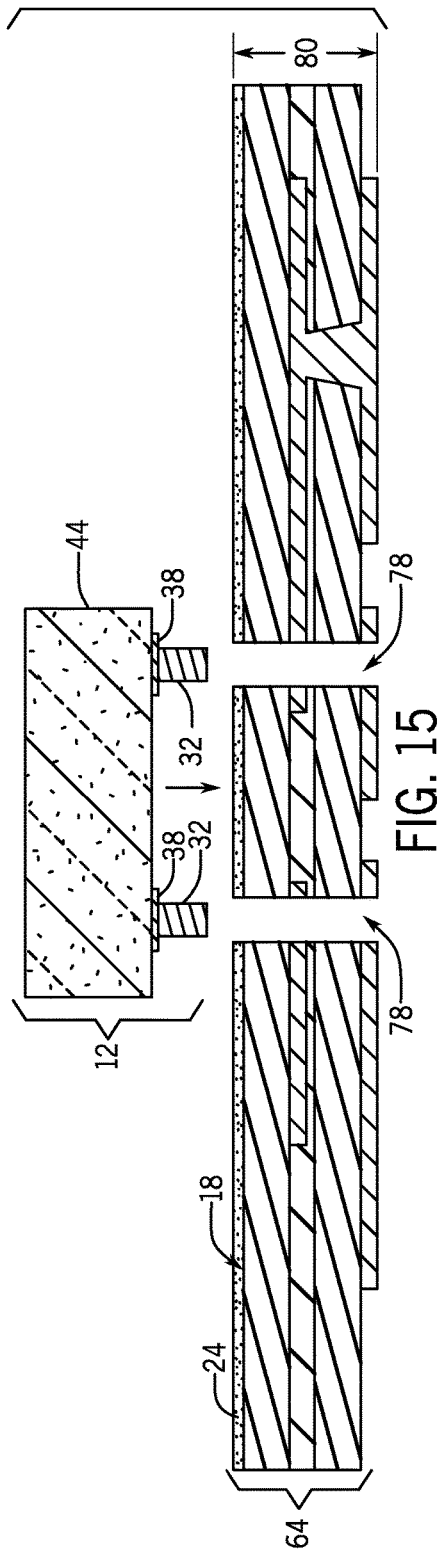

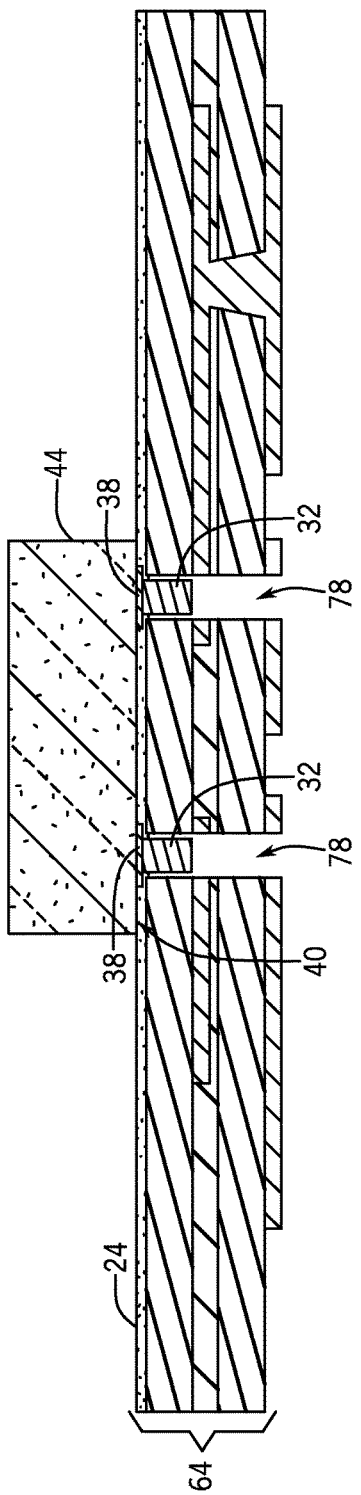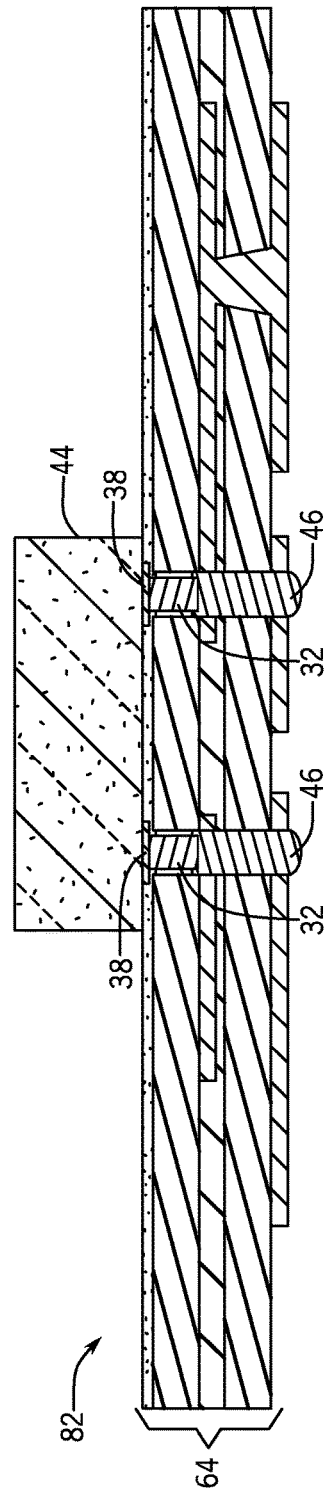

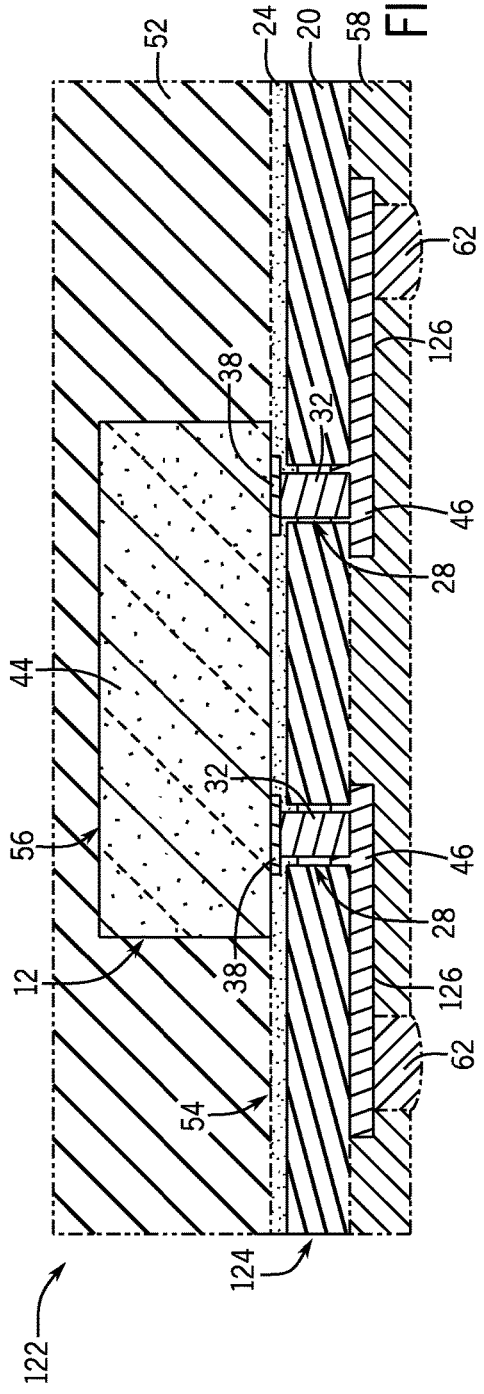

ELECTRONICS PACKAGE HAVING A SELF-ALIGNING INTERCONNECT ASSEMBLY AND METHOD OF MAKING SAME

BACKGROUND OF THE INVENTION

Embodiments of the invention relate generally to structures and methods for packaging electrical components and, more particularly, to an electronics package and associated method of manufacture that provides self-alignment of the electrical component(s) to a pre-tested interconnect assembly.

As semiconductor device packages have become increasingly smaller and yield better operating performance, packaging technology has correspondingly evolved from leaded packaging, to laminated-based ball grid array (BGA) packaging, to chip scale packaging (CSP), then flip chip packages, and now buried die/embedded chip build-up (ECBU) packaging. Advancements in semiconductor chip packaging technology are driven by ever-increasing needs for achieving better performance, greater miniaturization, and higher reliability. New packaging technology has to further provide for the possibilities of batch production for the purpose of large-scale manufacturing thereby allowing economy of scale.

A standard embedded device manufacturing process typically begins with coating a top surface of a mounting substrate with an adhesive and placing one or more semiconductor dies or chips into the adhesive. A plurality of re-distribution layers are then deposited onto the mounting substrate and the die(s) and are patterned to form a thin-film metal re-routing and interconnection system, with eight or more re-distribution layers being common. The re-distribution layers are typically formed from a benzocyclobutene (BCB) or polyimide material, for example, and applied via a spin-on or lamination application process. The electrical connection between the laminate re-distribution layers and the die(s) form an input/output (I/O) system to and from the die(s).

Advancements in IC packaging requirements pose challenges to the existing embedded chip build-up process. In order to manufacture smaller and more complex IC packages, dies must be positioned more closely together and with great precision on the dielectric. However, the adhesive layer that couples the dies to the dielectric can make precise alignment of closely spaced dies difficult. For example, when two or more dies are positioned in close proximity to one another on the dielectric, the dies have a tendency to "swim" or move out of the desired position during the adhesive curing process. In addition to merely moving out of the desired position, closely spaced dies may be attracted to one another while the adhesive is curing, a phenomenon that may cause the undesired result of dies touching or becoming stuck to one another in the final electronics package.

Additionally, in order to meet the continued demand for smaller and more complex IC packages, highly complex interconnect structures are integrated within embedded packages to form the electrical connections between embedded electrical components and package I/Os. These complex interconnect structures carry with them inherent yield losses resulting from processing defects such as electrical shorts and/or opens. These defects become more prevalent as line widths, line spacing, and via diameters are reduced as device I/O count increases. In conventional flip chip or wire bonded chip carrier assemblies, the interconnect structure is fully fabricated and electrically tested prior to assembling a costly chip. Thus, a defective interconnect structure does not cause the loss of a costly chip. The interconnect structure in embedded packaging techniques, on the other hand, is fabricated after the electronic devices have been incorporated into the structure, potentially causing a good chip to be scrapped with a bad package.

Accordingly, it would be desirable to provide a new electrical package structure and associated manufacturing process that can provide the advantages of an embedded chip module without the costly loss of a good electrical component due to a defective interconnect structure. There is a further need for a simplified method for fabricating an electronics package that allows for precise die alignment and closer die spacing within the IC package.

BRIEF DESCRIPTION OF THE INVENTION

In accordance with one aspect of the invention, an electronics package includes an interconnect assembly comprising a first insulating substrate, a first wiring layer formed on a lower surface of the first insulating substrate, and at least one through hole extending through the first insulating substrate and the first wiring layer. The electronics package also includes an electrical component assembly comprising an electrical component having an active surface coupled to an upper surface of the first insulating substrate opposite the lower surface. The active surface of the electrical comprises at least one metallic contact pad. At least one conductive stud is coupled to the at least one metallic contact pad and is positioned within the at least one through hole. A conductive plug contacts the first wiring layer and extends into the at least one through hole to at least partially surround the at least one conductive stud.

In accordance with another aspect of the invention, a method of manufacturing an electronics package includes providing a bumped component assembly comprising an electrical component and a plurality of conductive studs coupled to respective contact pads located on an active surface of the electrical component. The method also includes providing an interconnect assembly comprising a wiring layer formed on a first surface of an insulating substrate, the interconnect assembly having a plurality of through holes extending through the insulating substrate and the wiring layer. The method further includes coupling the bumped component assembly to a second surface of the insulating substrate such that the plurality of conductive studs extend into the plurality of through holes and forming a plurality of conductive plugs that electrically couple the contact pads of the electrical component to the wiring layer.

In accordance with another aspect of the invention, an electronics package includes an interconnect assembly comprising an insulating substrate having at least one wiring layer formed on a first surface thereof. The interconnect assembly has a plurality of through holes formed through the insulating substrate and the at least one wiring layer. An electrical component having an active surface is coupled to a second surface of the insulating substrate, the active surface comprising a plurality of contact pads. The electronics package further includes a plurality of conductive studs, each of the plurality of conductive studs coupled to a respective contact pad of the plurality of contact pads and extending into a respective through hole of the plurality of through holes. A plurality of conductive plugs extends into the plurality of through holes to electrically couple the plurality of conductive studs to the at least one wiring layer.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings:

FIG. 1 is a schematic cross-sectional view of an electronics package, according to an embodiment of the invention.

FIGS. 2, 3, and 4 are schematic cross-sectional side views of the interconnect assembly included within the electronics package of FIG. 1 during various stages of a manufacturing/build-up process, according to an embodiment of the invention.

FIGS. 5 and 6 are schematic cross-sectional side views of the bumped electrical component included within the electronics package of FIG. 1 during various stages of a manufacturing/build-up process, according to an embodiment of the invention.

FIGS. 7, 8, and 9 are schematic cross-sectional side views of the electronics package of FIG. 1 during various stages of a manufacturing/build-up process, according to an embodiment of the invention.

FIGS. 13 and 14 are schematic cross-sectional side views of a multi-layer interconnect assembly during various stages of a manufacturing/build-up process, according to an embodiment of the invention.

FIGS. 15, 16, and 17 are schematic cross-sectional side views of a multi-layer electronics package during various stages of a manufacturing/build-up process, according to an embodiment of the invention.

FIG. 21 is a schematic cross-sectional view of an electronics package, according to another embodiment of the invention.

FIG. 22 is a detailed view of FIG. 21 illustrating the electrical connection between the bumped electrical component and the interconnect assembly of the electronics package of FIG. 21, according to one embodiment of the invention.

DETAILED DESCRIPTION

Figure 10:
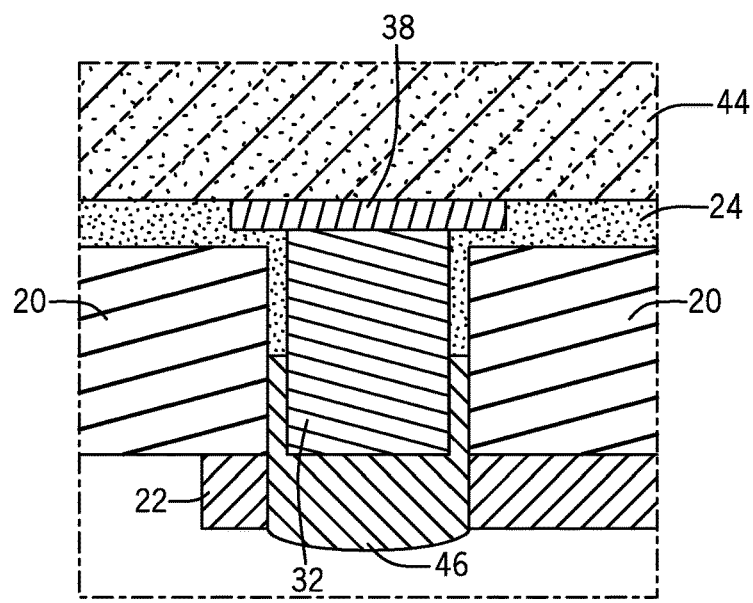
FIG. 10 is a detailed view of FIG. 9 illustrating the electrical connection between the bumped electrical component and the interconnect assembly of the electronics package of FIG. 1, according to one embodiment of the invention.

Embodiments of the present invention provide for an electronics package or module and associated method of manufacture that includes one or more "bumped" or "studded" electrical component assemblies coupled to an interconnect structure. Both the bumped electrical component and the interconnect structure are separately prefabricated, meaning that both components are fabricated during parallel manufacturing processes that occur prior to and separate from the assembly of the electronics package. Separate manufacture of the bumped electrical component and interconnect assembly allow the components to be pre-tested prior to final package assembly, thereby improving package yield. The prefabricated interconnect structure is manufactured to include multiple openings, referred to below as "through holes," which are sized and spaced to receive conductive studs or bumps formed on the contact pad locations of the electrical components. The interconnect structure is therefore self-aligning as the openings provide self centering for the bumped electrical components and hold the components in place during cure. Once the bumped electrical component is coupled to the interconnect structure, electrical connections are made between the electrical component and the wiring layer(s) of the prefabricated interconnect structure by filling the through holes with a conductive material. Further details of the manufacturing process and resulting structural electronics package are provided below.

As used herein, the term "semiconductor device" refers to a semiconductor component, device, die, or chip that perform specific functions such as a power transistor, power diode, analog amplifier, RF element, as non-limiting examples. Typical semiconductor devices include input/output (I/O) interconnections, referred to herein as contacts, contact pads, or bond pads, which are created by the semiconductor device manufacture. These contact pads are electrically coupled to internal elements within the semiconductor device are used to connect the semiconductor device to external circuitry.

The semiconductor devices described herein may be power semiconductor devices used as electrically controllable switches or rectifiers in power electronic circuits, such as switched mode power supplies, for example. Non-limiting examples of power semiconductor devices include insulated gate bipolar transistors (IGBTs), metal oxide semiconductor field effect transistors (MOSFETs), bipolar junction transistors (BJTs), integrated gate-commutated thyristors (IGCTs), gate turn-off (GTO) thyristors, Silicon Controlled Rectifiers (SCRs), diodes or other devices or combinations of devices including materials such as Silicon (Si), Silicon Carbide (SiC), Gallium Nitride (GaN), and Gallium Arsenide (GaAs). In use, power semiconductor devices are typically mounted to an external circuit by way of a packaging structure, with the packaging structure providing an electrical connection to the external circuit and also providing a way to remove the heat generated by the devices and protect the devices from the external environment. Typical power semiconductor devices include two (2) to four (4) input/output (I/O) interconnections to electrically connect both sides of a respective power semiconductor device to an external circuit. Semiconductor devices may also be digital logic devices, such as a microprocessor, microcontroller, memory device, video processor, or an Application Specific Integrated Circuit (ASIC), as non-limiting examples.

While the various embodiments of an electronics package referenced below are shown and described as including a particular arrangement of a bumped electrical component assembly including a semiconductor device electrically coupled to a single or multi-layer interconnect assembly, it is understood that alternative arrangements and configurations could also be implemented and thus embodiments of the invention are not limited only to the specifically illustrated devices and arrangements thereof. That is, the electronics package embodiments described below should also be understood to encompass electronic packages that might include additional electronic components and/or one or more alternative device types of semiconductor devices including acoustic devices, microwave devices, millimeter devices, RF communication devices, and micro-mechanical (MEMS) devices. The electronics packages described herein may also include one or more resistors, capacitors, inductors, filters and similar devices and combinations thereof. As used herein the term "electrical component" may be understood to encompass any of the various types of semiconductor devices described above as well as resistors, capacitors, inductors, filters, and similar passive devices.

Referring now to FIG. 1, a cross-sectional schematic view of an electronics package 10 is provided, according to an embodiment of the invention. Electronics package 10 includes a bumped electrical component assembly 12 coupled to an interconnect assembly 14. The structural components of the bumped component assembly 12 and interconnect assembly 14 are described in detail below with respect to the fabrication steps outlined in FIGS. 2-9. Bumped component assembly 12 and interconnect assembly 14 are manufactured in separate process flows, with FIGS. 2-4 illustrating steps for manufacturing interconnect assembly 14 and FIGS. 5 and 6 illustrating steps for manufacturing bumped component assembly 12. Once fabricated, bumped component assembly 12 and interconnect assembly 14 are assembled and further processed as shown in FIGS. 7-9 to form electronics package 10. Each of FIGS. 7-9 illustrate a cross-section of the electronics package 10 during the fabrication process. One skilled in the art will recognize that minor modifications to the steps described herein may be made to manufacture electronics package 10, or variations thereof. Further, the manufacturing steps may be carried out in an alternative order as that described herein while still arriving at a package construction similar to that of electronics package 10.

Referring now to FIG. 2, fabrication of interconnect assembly 14 begins by applying a layer of conductive material 16 to a first surface 18 of an insulating substrate 20. Insulating substrate 20 may be provided in the form of an insulating film or dielectric substrate, such as for example a Kapton® laminate flex, although other suitable electrically insulating materials may also be employed, such as Ultem®, Mylar®, polyethylene terephthalate (PET), polytetrafluoroethylene (PTFE), or another polymer film, such as a liquid crystal polymer (LCP) or a polyimide substrate, or inorganic films such as ceramic or glass, as non-limiting examples. Beneficially, use of a glass substrate material would permit higher operating temperatures.

According to alternative embodiments, layer of conductive material 16 is metal such as aluminum, copper, gold, silver, nickel, or other standard wiring metal, or combinations thereof as non-limiting examples, and may contain a barrier or adhesion metal such as titanium or chrome. The layer of conductive material 16 is deposited by one or more of sputtering, evaporation, electroless plating, electroplating, or other standard metal deposition processes. Alternatively, the layer of conductive material 16 is formed from an electrically conductive polymer or inks that contain conductive metal particles. In yet another alternative embodiment, manufacture of interconnect assembly 14 may begin by providing an insulating structure 20 including pre-plated layer of conductive material 16.

The layer of conductive material 16 is patterned to form an initial routing layer or wiring layer 22. In one embodiment, the patterning step may be carried out using a semi-additive patterning technique wherein a first seed metal or barrier metal (e.g., titanium) is applied to the first surface 18 of insulating substrate 20. A photo-resist (not shown) is applied to the seed metal and patterned, a layer of bulk metal (e.g., copper) is plated up atop the seed or barrier metal. The barrier layer can have a thickness of 0.01 to 1 micron and the bulk metal can have a thickness of 1 to 150 microns according to an exemplary, non-limiting embodiment. The photo-resist is removed and the exposed seed layer is removed by etching. The remaining seed metal and the plated up layer of metal form the wiring layer 22 illustrated in FIG. 1. In alternative embodiments, wiring layer 22 may be formed using other known patterning techniques such as, for example, fully subtractive patterning, semi-additive pattern plate-up, or additive plate-up. In yet other embodiments, wiring layer 22 is a printed conductive material formed using a deposition technique such as inkjet printing, screen printing, or dispensing, as non-limiting examples.

The manufacturing process continues in FIG. 3 by applying a component attach material 24 to the second surface 26 of insulating substrate 20. Component attach material 24 is an electrically insulating material capable of adhering to insulating substrate 20, bumped component assembly 12, and other components of electronics package 10, such as a polymeric material (e.g., epoxy, silicone, liquid crystal polymer, or a ceramic, silica, or metal filled polymer) or other organic material as non-limiting examples. In some embodiments, component attach material 24 is provided on insulating substrate 20 in either an uncured or partial cured (i.e., B-stage) form.

In the illustrated embodiment, component attach material 24 is applied to coat all of or substantially all of second surface 26 of insulating substrate 20. Alternatively, component attach material 24 may be applied to coat only one or more select portions of the insulating substrate 20 corresponding to component attach locations. In such instances, the component attach material 24 may be applied by stencil, screen printing, or using a direct dispense technique such as ink jetting, for example. Component attach material 24 may have a thickness in the range of 2 to 50 micrometers. In an alternative embodiment where insulating substrate 20 has adhesive properties, component attach material 24 would be omitted entirely. Non-limiting examples of such an adhesive insulating substrate include a spin-on dielectric such as polyimide or polybenzoxzaole (PBO). Component attach material 24 may also be omitted in embodiments where a component attach material is applied directly to bumped component assembly 12, as described in more detail below.

Referring to FIG. 4, one or more through holes 28 are formed through the thickness 30 of the interconnect assembly 14. These through holes 28 maybe be formed using any known technique, including a punching, mechanical drilling, or laser cutting technique, as non-limiting examples. In some embodiments, through holes 28 are formed to extend through the entire thickness 30 of interconnect assembly 14 in a single processing step using a technique such as punching or mechanical drilling, as non-limiting examples. Alternatively, through holes 28 may be formed using a multi-step process wherein openings are formed through the wiring layer 22 through hole locations and portions of the insulating substrate 20 and component attach material 24 in multiple steps. As one example, wiring layer 22 may be formed with prepatterned openings that match the locations of the through hole locations. These prepatterned openings can then be used to reference the drill locations or used to mask the laser beam in the subsequent process step(s) that remove portions of the insulating substrate 20 and (optionally) component attach material 24 at the through hole locations. In embodiments where insulating substrate 20 is glass, the through holes 28 would be formed through the insulating substrate 20 in an initial processing step prior to application of the component attach material 24 and prior to formation of wiring layer 22, with the through hole openings formed in wiring layer 22 and (optionally) component attach material 24 thereafter. Through holes 28 are formed having a circumference sized to receive the conductive studs 32 of the studded or bumped electrical component assembly 12. Optionally, a cover sheet 34 (shown in phantom) may be applied prior to forming through holes 28 to protect the surface of component attach material 24.

According to one embodiment, the conductive studs 32 of bumped component assembly 12 are formed during the manufacturing process illustrated in FIGS. 5 and 6, which begins by providing a semiconductor wafer 36 having a number of bond pads or contact pads 38 positioned on an active surface 40 of the wafer 36. Contact pads 38 serve as electrical I/O connections to internal circuitry within the wafer 36 and may be formed from aluminum, copper, or gold, as non-limiting examples. In the embodiment illustrated, contact pads 38 are raised bumps that extend away from the active surface 40 of wafer 36. Alternatively, contact pads 38 may be embedded within the active surface 40 of wafer 36 such that the active surface 40 and a top surface of contact pads 38 are co-planar.

As shown in FIG. 6, conductive studs 32 are formed on the contact pads 38 of the wafer 36 resulting in raised electrical contacts that extend upward and away from the active surface 40. Studs 32 are an electrically conductive material selected to form an acceptable bond with the underlying metallurgy of the contact pads 38. Where contact pads 38 are aluminum or gold, for example, conductive studs 32 may be gold or copper stud bumps. In some embodiments, conductive studs 32 have an aspect ratio in the range of 1:2 (e.g., 10 µm thick stud 32 on a 20 µm pad) to greater than 50:1. Different processing techniques may used to form conductive studs 32 depending on the desired aspect ratio of the conductive studs 32 to the contact pads 38, with plating and stud bump techniques being used to form conductive studs 32 on the lower end of the aspect ratio range and vertical lead processes using a wirebonding tool used to form conductive studs 32 on the higher end of the range of aspect ratios. However, it is contemplated that studs may have dimensions outside of this range based on the requirements of a specific application and the manufacturing technique used to form the studs.

According to various embodiments, conductive studs 32 may be formed as stud bumps, plated bumps, pillars, solder balls, or thin (e.g., 500 A to 2 µm thick) layer of under bump metallization (UBM) electrically coupled to contact pads 38. In some embodiments, conductive studs 32 may have approximately the same x-y size of the contact pads 38. As one non-limiting example, conductive studs 32 are formed using a wirebonder. The wire bonding process yields an ultrasonically formed interface between the contact pads 38 and the conductive studs 32. Conductive studs 32 formed in this matter may be gold stud bumps bonded to contact pads 38 or may be formed from copper wire, or any other material suitable for use in a wire bonding operation and may have. In another embodiment, conductive studs 32 are solder bumps coupled to contact pads 38. These solder bumps may either be directly coupled to contact pads 38 (in embodiments where contact pads 38 are a solderable material, such as, for example copper) or by way of an optional metal finish layer (not shown) such as Ni or Ni/Au formed on the contact pads 38 to aid solderability. In yet another embodiment, conductive studs 32 are proud plated pads formed by sputter-plating metal layers onto contact pads 38.

In one embodiment, conductive studs 32 are formed from a single layer of electrically conductive material, such as, for example, gold, copper, solder, and the like, or a metal-filled polymer. Alternatively, conductive studs 32 may be multi-material and multi-layer structures, with an initial layer formed from a material selected to promote adhesion with the underlying metallurgy of the conductive studs 32 and one or more subsequent build-up layers coating at least a portion of the initial layer and formed from other electrically conductive materials selected to facilitate the electrical connection between conductive studs 32 and the wiring layer 22 of interconnect assembly 14.

After forming conductive studs 32, wafer 36 is sawn or singulated into a plurality of individual bumped component assemblies 12 along scribe lines 42. Each bumped electrical component assembly 12 includes an individual electrical component 44 and conductive studs 32 electrically coupled to the contact pads 38 of the electrical component 44. In an alternative embodiment, conductive studs 32 are formed directly on the individual electrical component 44, rather than at the wafer-level.

Referring now to FIG. 7, the fabrication process for electronics package 10 continues by removing optional cover sheet 34 (when included) and using conventional pick and place equipment and methods to position bumped component assembly 12 with the active surface 40 of its electrical component 44 facing toward the component attach material 24 of interconnect assembly 14. Bumped component assembly 12 is positioned into the component attach material 24 such that the conductive studs 32 are received within the through holes 28 of interconnect assembly 14, as shown in FIG. 8. Conductive studs 32 and through holes 28 thus permit electrical component 44 to self-align and register with the conductive routing pattern of wiring layer 22. The bumped component assembly 12 is bonded to the insulating substrate 20 by fully curing the component attach material 24 using heat, UV light, or microwave radiation, as examples. Depending on their geometry, through holes 28 may provide self-centering and serve to lock the electrical component 44 in place to reduce component swim during cure. More specifically, the relative size and/or relative shape of through holes 28 and conductive studs 32 may be selected to aid in alignment and tolerancing. As one non-limiting example, round conductive studs 32 may be used in combination with elliptical through holes 28. Conductive studs 32 may also be conical, frustro-conical, or frustro-pyramidal in shape to aid in self-centering within through holes 28. Alternatively or in addition, the side walls of through holes 28 may be tapered such that the cross-sectional area of first surface 18 is greater than that of second surface 28 and effects a precise alignment as conductive studs 32 are inserted into through holes 28. In one embodiment, a partial vacuum and/or above atmospheric pressure may be used to promote the removal of volatiles from the component attach material 24 during cure if any are present.

While the above description contemplates component attach material 24 as being provided on interconnect assembly 14, component attach material 24 may be applied directly to the active surface 40 of bumped electrical component 12, either prior to or after singulation. In such an embodiment, component attach material 24 would be omitted from interconnect assembly 14.

In a next step of the manufacturing process shown in FIG. 9, one or more conductive plugs 46 are formed to create an electrical connection between the interconnect assembly 14 and the conductive stud(s) 32, thus allowing electrical contact to electrical component 44. Conductive plugs 46 are an electrically conductive material that may be applied using a number of different techniques, including, for example, electroless metallization, ink jet fill, a sputter and plating technique. Alternatively, conductive plugs 46 may be a conductive paste such as, for example, solder, a solder paste, or a conductive epoxy such as, for example, silver flakes suspended in a polymer base. Optionally, a grinding or polishing step may follow the formation of conductive plugs 46 in order to remove excess material extending beyond the lower surface of wiring layer 22 to allow for subsequent build up layers to be applied.

Figure 11:
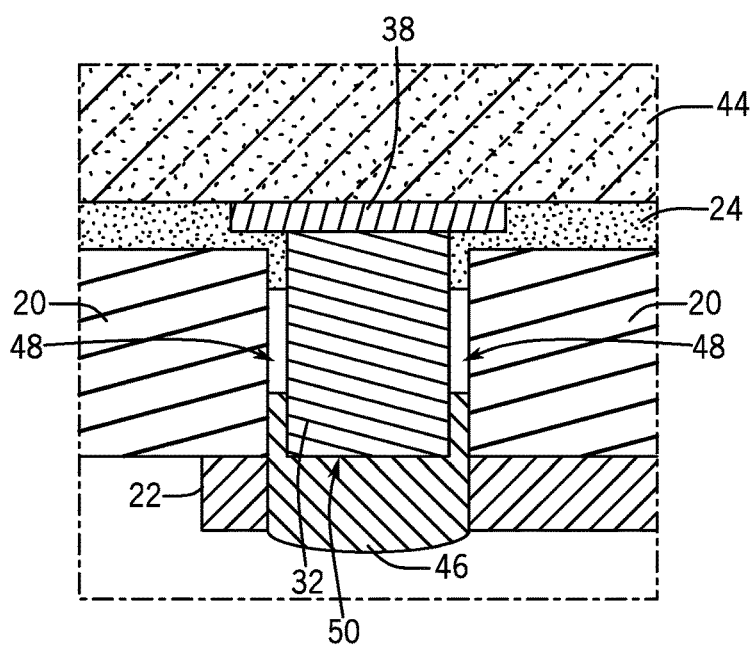
FIG. 11 is a detailed view of FIG. 9 illustrating the electrical connection between the bumped electrical component and the interconnect assembly of the electronics package of FIG. 1, according to another embodiment of the invention.

Detailed views of the interface between the conductive studs 32 and the electrical connection 46 are shown in FIGS. 10 and 11 according to alternative embodiments of the invention. Referring first to FIG. 10, an embodiment is shown where the conductive studs 32 are completely surrounded within the through holes 28 by a combination of the component attach material 24 and the conductive plugs 46. In such an embodiment, a small amount of the component attach material 24 is forced into the through holes 28 when the bumped component assembly 12 is positioned on the interconnect assembly 14. Electrical connections 46 are formed in a manner that results in filling the remainder of the open space within the through holes 28. Alternatively, conductive plugs 46 may be formed in the manner shown in FIG. 11 with an air gap 48 surrounding a portion of the conductive studs 32. In yet other embodiments, conductive plugs 46 may be formed to physically contact only the top surface 50 of the conductive studs 32 or to fill the entirely of the volume of through holes 28 surrounding conductive studs 32. It is contemplated that other embodiments may include through holes 28 that are completely free of component attach material 24, including, for example, embodiments that utilize an insulating substrate 20 with inherent adhesive properties. Further, conductive plugs 46 may be formed such that they extend partially over the exposed outward-facing surface of wiring layer 22.

Figure 12:
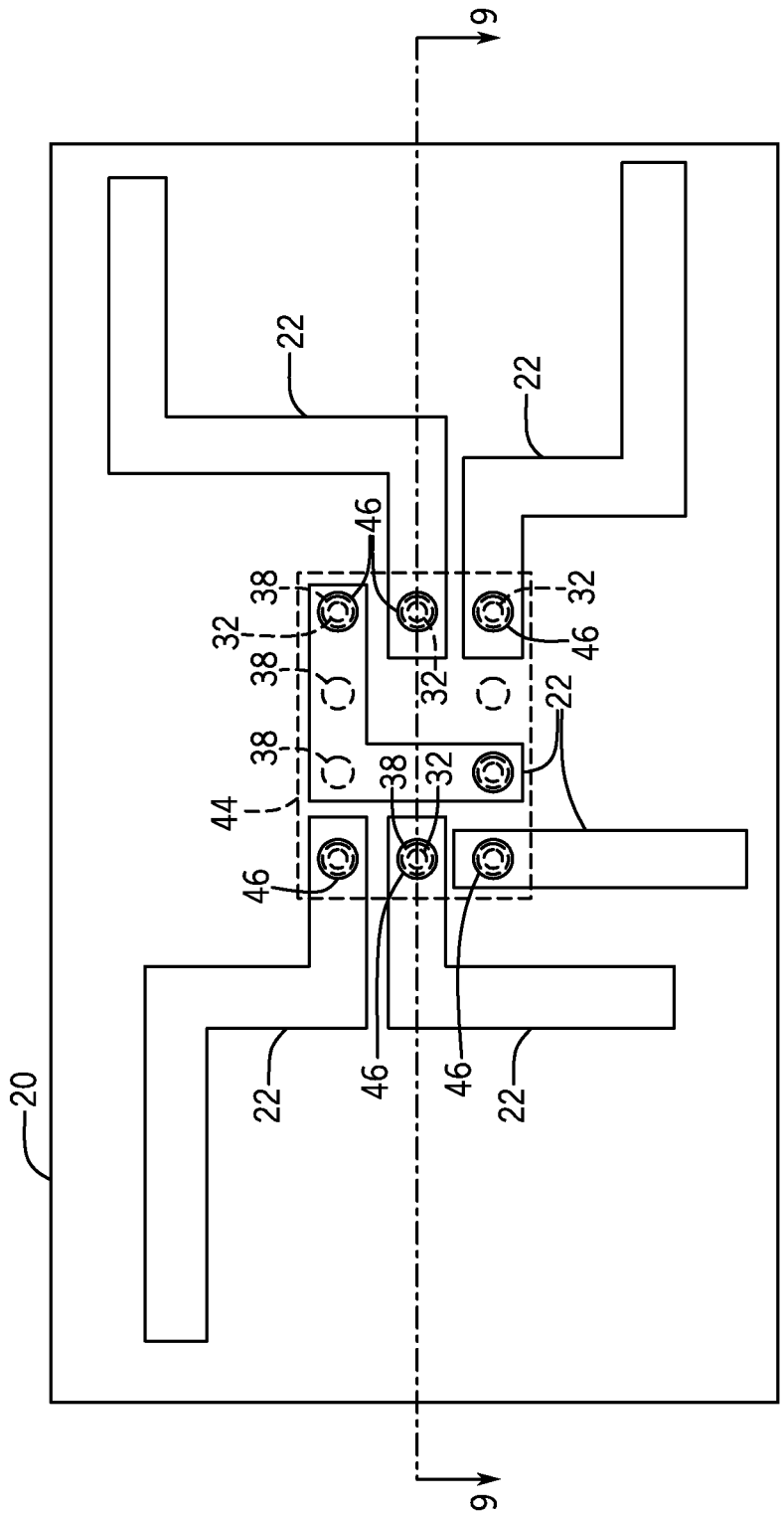
FIG. 12 is a schematic bottom view of FIG. 9.

An exemplary configuration of wiring layer 22 is provided in FIG. 12. As shown, each conductive plug 46 forms an electrical connection between the underlying conductive stud 32 and a conductive trace of wiring layer 22. However, one skilled in the art will recognize that wiring layer 22 may be formed in numerous alternative configurations based on the contact pad configuration of the electrical component 44, the desired locations of I/Os within the final electronics package, any desired interconnections between individual contact pads of the electrical component 44, and between multiple electrical components in instances where the final electronics package is a multi-chip module.

Referring again to FIG. 1, in certain embodiments the manufacturing process further includes application of an optional layer of electrically insulating material 52 (shown in phantom) that overlays the bumped electrical component 12 and exposed portions of a top surface 54 of the interconnect assembly 14. According to alternative and non-limiting embodiments, insulating material 52 may be applied using a pour molding, transfer molding, injection molding, or compression molding process. Insulating material 52 may encapsulate all of bumped electrical component 12 or portions thereof, in alternative embodiments. For example, in embodiments where bumped electrical component 12 includes an optical component an opening (not shown) may be formed within insulating material 52 above a portion of the active surface of the optical component. In alternative embodiments, insulating material 52 may be an optically transparent material. It is contemplated that a similar opening or optically transparent material may be integrated within the other embodiments of electronics packages disclosed herein in a similar manner. Alternatively, a back grinding operation may be employed to remove a portion of insulating material 52 and expose a second surface 56 of electrical component 44.

Certain embodiments may also include forming an optional solder mask 58 (shown in phantom) applied to the outermost bottom surface 60 of the interconnect assembly 14. In the illustrated embodiment, solder mask 58 is applied to portions of the wiring layer 22 and exposed portions of insulating substrate 20 and patterned as shown. Following application of solder mask 58, a solder layer 62 is formed as shown to provide I/O connections to the bottom surface 60 of the interconnect assembly 14. In one embodiment, solder layer 62 is formed as balls that are soldered to solder mask 58 (e.g., solder balls forming a Ball Grid Array (BGA)). It is also envisioned, however, that other forms of I/O interconnections can be attached, such as plated bumps, pillar bumps, gold stud bumps, metal filled polymer bumps, or wirebond connections/pads, such that electrical connections can be made between the electrical component 44 and external components (not shown) such as, for example, a motherboard or printed circuit board (PCB).

Referring now to FIGS. 13 and 14, the manufacturing process for a multi-layer interconnect assembly 64 is shown according to an alternative embodiment of the invention. Manufacture of the multi-layer interconnect assembly 64 begins forming a first wiring layer 22 on a second surface 26 of insulating substrate 20 in a similar manner as described with respect to interconnect assembly 14 (FIG. 4). A second insulating substrate 66 is coupled to the interconnect assembly 14 by way of an intermediate layer of component attach material 68. After the component attach material 68 is cured, one or more vias 70 are formed through the thickness of the insulating substrate 66 to expose one or more select portions of the first wiring layer 22. Vias 70 may be formed by a UV laser drilling or dry etching, photo-definition, or mechanical drilling process as non-limiting examples. Alternately, vias 70 may be formed by way of other methods including: plasma etching, dry and wet etching, or other laser techniques such as CO2 and excimer. Vias 70 may have straight sides or may be formed having angled side surfaces, as shown in FIG. 13, to facilitate later filling and metal deposition. In alternative embodiments, second insulating substrate 70 is provided with pre-drilled vias 70.

The manufacturing process continues in FIG. 14 by depositing a second wiring layer 72 or metallization layer on a lower surface 74 of the second insulating substrate 66. In one embodiment second wiring layer 72 extends into vias 70, thereby forming penetrating contacts 76 that electrically connect second wiring layer 72 to select portions of first wiring layer 22. Alternatively, all or a portion of vias 70 may be left "open" as holes following application of second wiring layer 72 and later filled with the same conductive material as is used to form conductive plugs 46 to electrically couple first wiring layer 22 to second wiring layer 72, thus reducing a step. It is contemplated that second wiring layer 72 may be formed and patterned to define one or more electrical traces using any of the techniques described with respect to first wiring layer 22. After formation of second wiring layer 72, additional build-up or rerouting layers comprising insulating material and patterned wiring layers may be added to the multi-layer interconnect assembly 64. One skilled in the art will recognize that the number of additional levels of rerouting to be dependent upon design considerations of a particular application. At this stage, the multi-layer structure may be electrically tested.

Referring now to FIG. 15, component attach material 24 is applied to first surface 18 of insulating substrate 20 and one or more through holes 78 are then formed through the thickness 80 of the interconnect assembly 64, yielding the multi-layer interconnect assembly 64 illustrated in FIG. 15. Through holes 78 may be formed in a similar manner as described with respect to through holes 28 (FIG. 4) and are sized to receive conductive studs 32 of bumped component assembly 12. In alternative embodiments, one or both of insulating substrates 20, 66 are provided with pre-drilled openings corresponding to the locations of through holes 78.

The bumped component assembly 12 is coupled to the multi-layer interconnect assembly 64 by positioning the active surface 40 of electrical component 44 into component attach material 24, as shown in FIG. 16. Again, through holes 78 serve to self-align and register the bumped component assembly 12 with the multi-layer interconnect assembly 64 during the assembly process. The bumped component assembly 12 is then bonded to the multi-layer interconnect assembly 64 by fully curing the component attach material 24 in a similar manner as described with respect to FIG. 8, with the engagement between conductive studs 32 and through holes 78 preventing the electrical component 44 to move or "swim" as the component attach material 24 cures.

Referring to FIG. 17, the conductive studs 32 of bumped component assembly 12 are electrically coupled to select portions of the first wiring layer 22 and second wiring layer 72 by way of conductive plugs 46, which may be formed using any of the techniques described with respect to FIG. 9. Depending on the desired application, the electronics package 82 of FIG. 17 may be subjected to further processing steps including the addition of an insulating material surrounding electrical component 44 and/or the formation of I/O connections on the lower surface of electronics package 82, similar to that described with respect to FIG. 1.

Figure 19:
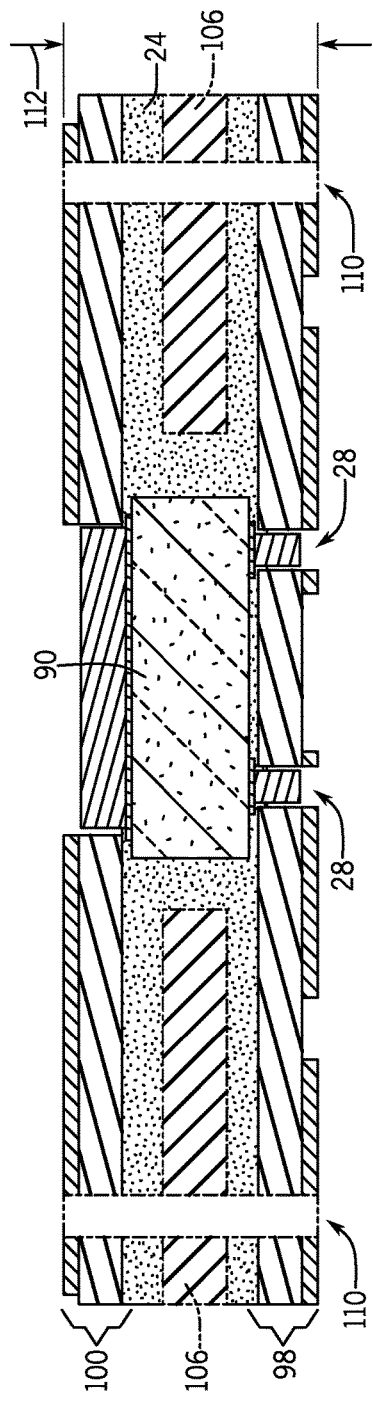
Figure 20:
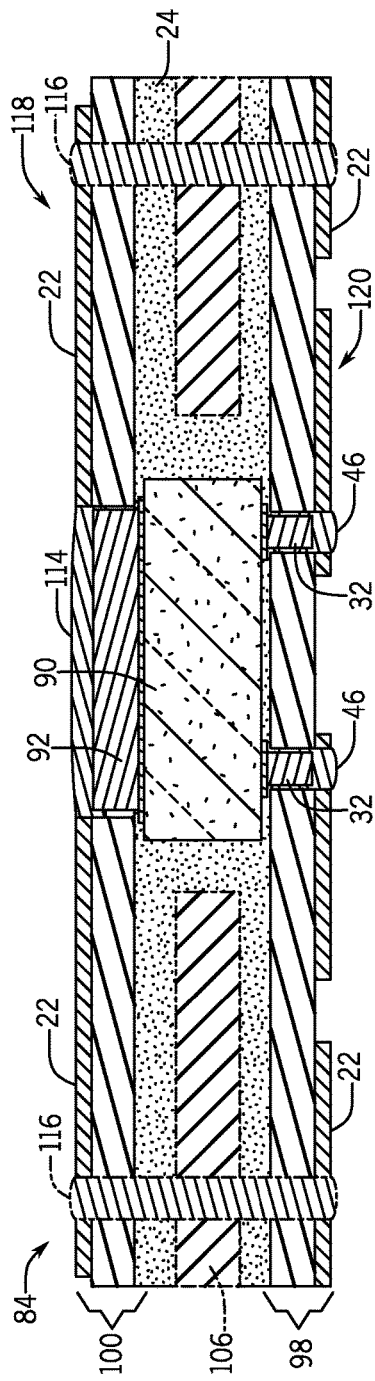

The manufacturing techniques described with respect to FIGS. 2-17 may further be extended for use with dual-sided electrical components, according to various embodiments of the invention. One such exemplary embodiment is illustrated with respect to the manufacturing technique of FIGS. 18-20, which results in the fabrication of a dual-sided electrical package 84 (FIG. 20). Dual-sided electrical package 84 incorporates one or more electrical components that include frontside and backside electrical connections. Examples of such electrical components include power semiconductor devices and RF devices. The technique includes fabricating a dual-sided bumped component assembly 86 by forming conductive studs 32 on the contact pads 38 located on an active or first surface 88 of electrical component 90 using a similar technique as described in FIG. 6. One or more conductive studs 92 are also formed on the contact pad(s) 94 located on the backside or second surface 96 of electrical component 90. Conductive stud(s) 92 may be formed from similar materials and using similar manufacturing techniques as described herein for conductive studs 32.

Figure 18:
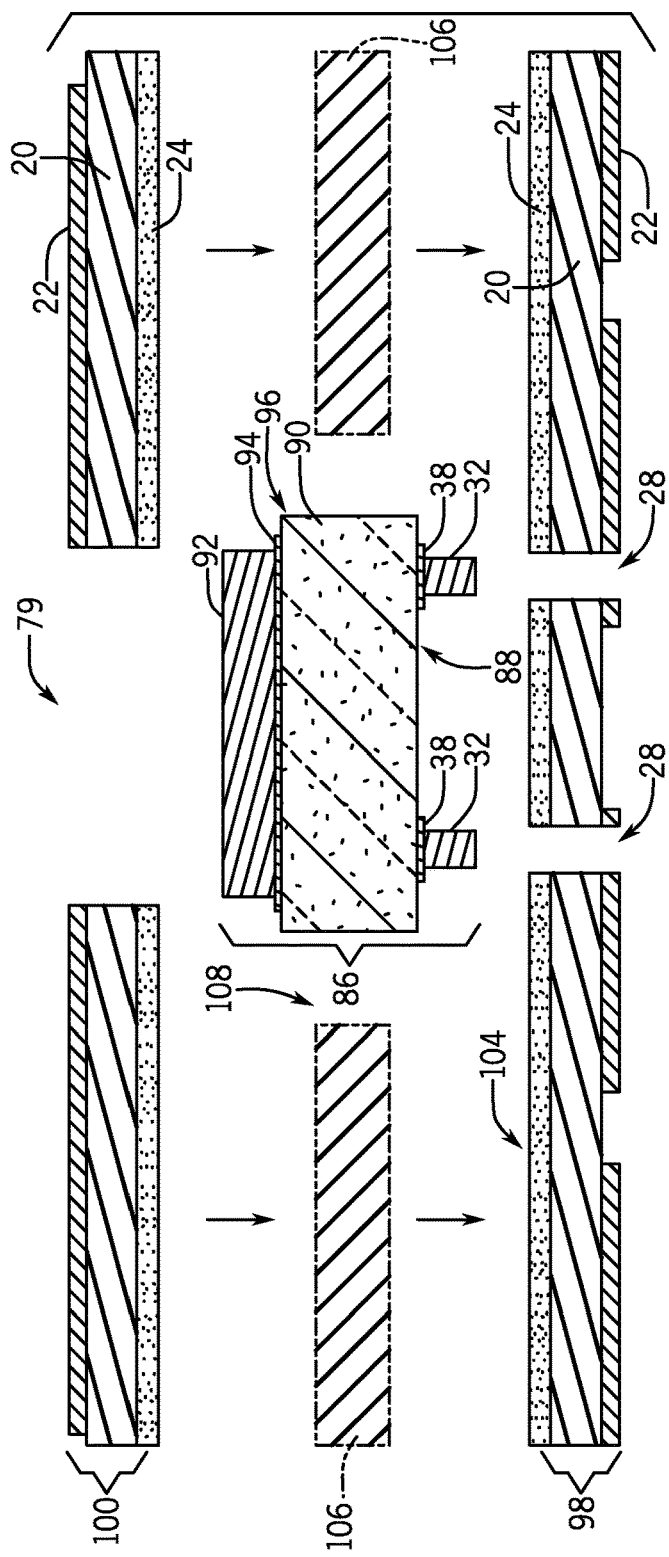
FIGS. 18, 19, and 20 are schematic cross-sectional side views of an electronics package incorporating a dual-sided electrical component during various stages of a manufacturing/build-up process, according to an embodiment of the invention.

The manufacturing technique continues by sandwiching the dual-sided bumped component assembly 86 between a first interconnect assembly 98 and a second interconnect assembly 100, each of which are manufactured using in a similar manner as described with respect to interconnect assembly 14 (FIG. 4), and as such are illustrated with common part numbering as appropriate. As shown in FIGS. 18 and 19, the through holes 28 of first interconnect assembly 98 correspond in size and location with conductive studs 32 on the first surface 88 of dual-sided bumped component assembly 86. Likewise, the through hole(s) 78 of second interconnect assembly 100 correspond in size and location with the conductive stud(s) 92 located on the second surface 96 of dual-sided bumped component assembly 86. The interfit between through holes 28/conductive studs 32 and through hole(s) 78/conductive stud(s) 92 thereby serves to self-align and register first interconnect assembly 98, second interconnect assembly 100, and dual-sided bumped component assembly 86 during the assembly process.

As shown in FIG. 18, manufacture of dual-sided electrical package 84 begins by positioning the first surface 88 of dual-sided bumped component assembly 86 into the component attach material 24 of first interconnect assembly 98. Second interconnect assembly 100 is then positioned over the dual-sided assembly 86 with its layer of component attach material 24 facing toward the second surface 96 of dual-sided assembly 86. The subassemblies are bonded together by curing the component attach material 24 within each interconnect assembly 98, 100.

Additional structural support may be provided to dual-sided electrical package 84 by providing an optional core structure 106 (shown in phantom) between first and second interconnect assemblies 98, 100, with the core structure 106 including an opening 108 sized to surround dual-sided bumped component 86. According to various embodiments core structure 106 may be a printed circuit board (PCB) core material, such as, for example, an epoxy material with a fiberglass mat, a pre-preg material, polyimide film/layer, a ceramic material, glass, aluminum, a composite dielectric material, or other similar/suitable organic material or inorganic material that provides mechanical robustness to dual-sided electrical package 84. Core structure 106 may include conductive routing to provide electrical functionality. Core structure 106 may either be coupled to insulating structure 20 using component attach material 24 or another layer of joining material (not shown). A core structure may be included with the electronics package 10 of FIG. 1 in a similar manner.

Referring now to FIG. 19, in one embodiment manufacture continues by forming one or more optional through holes 110 (shown in phantom) through the combined thickness 112 of dual-sided electrical package 84, as shown in FIG. 19. Through holes 110 may be formed using similar techniques as previously disclosed for through holes 28.

Conductive plugs 46, shown in FIG. 20, electrically connect conductive studs 32 to the first wiring layer 22 of first interconnect assembly 98. Conductive plugs 114 are formed in a similar manner to electrically connect conductive stud(s) 92 to the wiring layer 22 of second interconnect assembly 100. It is contemplated that conductive plugs 46, 114 (either alone or in combination with component attach material 24) may entirely fill and surround through holes 28, 78. Alternatively, manufacture may result in the formation of a small air gap between studs 32, 92 and respective insulating substrates 20.

In embodiments where an electrical connection is desired between the first interconnect assembly 98 and the second interconnect assembly 100, the wiring layers 22 of the respective assemblies 98, 100 are electrically connected using conductive plugs 116 (shown in phantom) that extend through optional through hole(s) 110 to contact a portion each wiring layer 22 as shown in FIG. 20. Conductive plugs 116 may be formed in a similar manner and using similar materials as conductive plugs 46. Optionally, exposed portions of conductive plugs 46, 114, 116 may be removed using grinding or polishing operations so as to be co-planar with the outward-facing surface of the respective first wiring layer 22.

While not shown in FIG. 20, it is contemplated that I/O connections formed using a masking and solder operation may be provided on either or both of the top surface 118 and bottom surface 120 of dual-sided electrical package 84, in a similar manner as described with reject to FIG. 1.

While FIGS. 7-9 illustrate the manufacture of a single electronics package, one skilled in the art will recognize that multiple electronics packages could be manufactured in a similar manner at the panel level and then singulated into individual electronics packages as desired. In such a case, the step of singulating the bumped wafer (FIG. 6) into individual bumped components may be modified to segment the bumped wafer into subsections containing multiple bumped components or omitted entirely.

In another embodiment, a panel-level manufacturing technique may include manufacturing a panel-scale interconnect assembly that includes sites for multiple electrical packages. The routing pattern of the prefabricated interconnect assembly could be pre-tested after manufacture to identify any site locations with defects. Individual, singulated bumped electrical component assemblies would then be coupled to the defect free site locations on the panel-scale interconnect assembly either before or after singulating the panel-scale interconnect assembly into individual package-size components.

FIG. 21 illustrates an electronics package 122 according to an alternative embodiment of the invention. Electronics package 122 includes a number of similar components as electronics package 10 (FIG. 1), which are referred to with common part numbers as appropriate. Manufacture of electronics package 122 begins in a similar manner as electronics package 10 by coupling bumped electrical component assembly 12 into the component attach material layer 24 of an interconnect assembly 124 such that the conductive studs 32 of bumped electrical component assembly 12 extend into through holes 28 formed in insulating substrate 20. However, interconnect assembly 124 differs from interconnect assembly 14 (FIG. 1) in that does not include wiring layer 22 (FIG. 1). Instead, wiring layer 22 is replaced with a conductive layer 126 that forms both the routing pattern on the first surface 18 of insulating substrate 20 and extends into through holes 28 to form an electrical connection to the conductive studs 32 of bumped electrical component assembly 12. A detailed view of the interface between conductive studs 32 and conductive layer 126 is provided in FIG. 22, according to one embodiment of the invention. In alternative embodiments conductive layer 126 may completely fill through hole 28 such that it contacts component attach material 24.

Conductive layer 126 may be formed using any of the same materials and techniques described above for conductive plugs 46. As one non-limiting example, conductive layer 126 may be formed of a conductive, sinterable paste applied using an ink jetting or direct writing process, with the conductive paste formed from a material capable of withstanding higher operating temperatures than traditional copper metallization.

In the above-described embodiments, the disclosed interconnect assembly is manufactured as a pre-fabricated module, which permits the electrical routing layers of the interconnect assembly and the viability of the electrical component to be tested independently prior to package assembly, thereby improving yield loss. Engagement between the conductive bumps and the prefabricated interconnect assembly self-aligns the components during assembly and maintains the alignment during cure. Use of the bumped component assembly also allows for smaller pre-drilled openings to be formed in the insulating substrate, thereby reducing the impact of adhesive encroachment and permitting a tighter achievable pitch in the electronics package, such as, for example, 10-20 micrometers. The electronics packages disclosed herein also provide a thinner overall package profile as compared to prior art flip chip topologies as a result of the conductive studs 32 being recessed within the thickness of the insulating substrate 20. The disclosed manufacturing technique also reduces processing steps as compared to prior art embedded techniques and eliminates expensive tooling such as reactive ion etching (ME) and sputtering. Accordingly, the embodiments described herein provide a low cost solution for manufacturing complex, miniaturized embedded electronics packages with higher performance as compared to prior art approaches.

Therefore, according to one embodiment of the invention, an electronics package includes an interconnect assembly comprising a first insulating substrate, a first wiring layer formed on a lower surface of the first insulating substrate, and at least one through hole extending through the first insulating substrate and the first wiring layer. The electronics package also includes an electrical component assembly comprising an electrical component having an active surface coupled to an upper surface of the first insulating substrate opposite the lower surface. The active surface of the electrical comprises at least one metallic contact pad. At least one conductive stud is coupled to the at least one metallic contact pad and is positioned within the at least one through hole. A conductive plug contacts the first wiring layer and extends into the at least one through hole to at least partially surround the at least one conductive stud.

According to another embodiment of the invention, a method of manufacturing an electronics package includes providing a bumped component assembly comprising an electrical component and a plurality of conductive studs coupled to respective contact pads located on an active surface of the electrical component. The method also includes providing an interconnect assembly comprising a wiring layer formed on a first surface of an insulating substrate, the interconnect assembly having a plurality of through holes extending through the insulating substrate and the wiring layer. The method further includes coupling the bumped component assembly to a second surface of the insulating substrate such that the plurality of conductive studs extend into the plurality of through holes and forming a plurality of conductive plugs that electrically couple the contact pads of the electrical component to the wiring layer.

According to yet another embodiment of the invention, an electronics package includes an interconnect assembly comprising an insulating substrate having at least one wiring layer formed on a first surface thereof. The interconnect assembly has a plurality of through holes formed through the insulating substrate and the at least one wiring layer. An electrical component having an active surface is coupled to a second surface of the insulating substrate, the active surface comprising a plurality of contact pads. The electronics package further includes a plurality of conductive studs, each of the plurality of conductive studs coupled to a respective contact pad of the plurality of contact pads and extending into a respective through hole of the plurality of through holes. A plurality of conductive plugs extends into the plurality of through holes to electrically couple the plurality of conductive studs to the at least one wiring layer.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. An electronics package comprising:
   an interconnect assembly comprising:
      a first insulating substrate;
      a first wiring layer formed on a lower surface of the first insulating substrate; and
      at least one through hole extending through the first insulating substrate and the first wiring layer;
   an electrical component assembly comprising:
      an electrical component having an active surface coupled to an upper surface of the first insulating substrate opposite the lower surface, the active surface of the electrical comprising at least one metallic contact pad; and
      at least one conductive stud coupled to the at least one metallic contact pad and positioned within the at least one through hole;
   a conductive plug contacting the first wiring layer and extending into the at least one through hole to at least partially surround the at least one conductive stud; and
   a component attach material coupling the active surface of the electrical component to the first insulating substrate.

2. The electronics package of claim 1 wherein a portion of the component attach material extends into the at least one through hole.

3. The electronics package of claim 1 wherein the electrical component assembly comprises a plurality of conductive studs and a plurality of metallic contact pads; and
   wherein each of the plurality of conductive studs is coupled to a respective metallic contact pad of the plurality of metallic contact pads.

4. The electronics package of claim 1 wherein the at least one conductive stud comprises a first material; and
   wherein the at least one metallic contact pad comprises a second material, different from the first material.

5. The electronics package of claim 4 wherein the first wiring layer comprises a third material, different from the first material and the second material.

6. The electronics package of claim 1 wherein the conductive plug comprises a conductive paste.

7. The electronics package of claim 1 wherein a portion of the at least one conductive stud within the at least one through hole is surrounded by an air gap.

8. The electronics package of claim 1 further comprising:
   a second insulating substrate coupled to the first insulating substrate; and
   a second wiring layer formed on the second insulating substrate and extending through at least one via formed therein to electrically couple with the first wiring layer.

9. The electronics package of claim 8 wherein the at least one through hole extends through the second insulating substrate and the second wiring layer; and
   wherein the conductive plug is in contact with the second wiring layer.

10. A method of manufacturing an electronics package comprising:
    providing a bumped component assembly comprising an electrical component and a plurality of conductive studs coupled to respective contact pads located on an active surface of the electrical component;
    providing an interconnect assembly comprising a wiring layer formed on a first surface of an insulating substrate, the interconnect assembly having a plurality of through holes extending through the insulating substrate and the wiring layer;
    coupling the bumped component assembly to a second surface of the insulating substrate by way of a component attach material such that the plurality of conductive studs extend into the plurality of through holes; and
    forming a plurality of conductive plugs that electrically couple the contact pads of the electrical component to the wiring layer.

11. The method of claim 10 wherein forming the plurality of conductive plugs comprises dispensing an electrically conductive material into the plurality of through holes.

12. The method of claim 10 wherein forming the plurality of conductive plugs comprises surrounding at least a portion of each of the plurality of conductive studs within the plurality of through holes with a conductive material.

13. The method of claim 10 further comprising
    applying a component attach material to one of the active surface of the electrical component and the second surface of the insulating substrate;
    and
    curing the component attach material.

14. The method of claim 10 further comprising removing a portion of each of the plurality of conductive plugs that extends beyond a surface of the wiring layer facing away from the insulating substrate.

15. An electronics package comprising:
    an interconnect assembly comprising an insulating substrate having at least one wiring layer formed on a first surface thereof, the interconnect assembly having a plurality of through holes formed through the insulating substrate and the at least one wiring layer;
    an electrical component having an active surface coupled to a second surface of the insulating substrate by way of a component attach material, the active surface comprising a plurality of contact pads;
    a plurality of conductive studs, each of the plurality of conductive studs coupled to a respective contact pad of the plurality of contact pads and extending into a respective through hole of the plurality of through holes; and
    a plurality of conductive plugs extending into the plurality of through holes to electrically couple the plurality of conductive studs to the at least one wiring layer.

16. The electronics package of claim 15 wherein the at least one wiring layer comprises a first wiring layer formed on the first surface of the insulating substrate and a second wiring layer;
    wherein the interconnect assembly further comprises a second insulating substrate positioned between the first wiring layer and the second wiring layer; and
    wherein the plurality of through holes extend through the insulating substrate, the second insulating substrate, and the first and second wiring layers.

17. The electronics package of claim 16 wherein a conductive plug of the plurality of conductive plugs is electrically coupled to the first wiring layer and the second wiring layer within a respective through hole of the plurality of through holes.

18. The electronics package of claim 15 wherein each of the plurality of conductive plugs surrounds at least a portion of a respective conductive stud within a respective through hole.

19. The electronics package of claim 15 wherein a portion of the component attach material extends into the plurality of through holes.

* * * * *